United States Patent
Joung et al.

(10) Patent No.: US 9,632,130 B2
(45) Date of Patent: Apr. 25, 2017

(54) APPARATUS AND METHOD FOR DETECTING CABLE FAULT

(71) Applicant: INNOWIRELESS CO., LTD., Gyeonggi-do (KR)

(72) Inventors: Jin Soup Joung, Gyeonggi-do (KR); Sung Chan Choi, Gyeonggi-do (KR); Yong Hoon Lim, Seoul (KR); Kyoung Hwan Ju, Gyeonggi-do (KR); Hyo Bin Yim, Chungcheongnam-do (KR)

(73) Assignee: INNOWIRELESS CO., LTD., Gyeonggi-do (KR)

( * ) Notice: Subject to any disclaimer, the term of this patent is extended or adjusted under 35 U.S.C. 154(b) by 102 days.

(21) Appl. No.: 14/618,206

(22) Filed: Feb. 10, 2015

(65) Prior Publication Data

US 2016/0202309 A1    Jul. 14, 2016

(30) Foreign Application Priority Data

Jan. 12, 2015   (KR) .......................... 10-2015-0004432

(51) Int. Cl.
   *G01R 31/11*   (2006.01)
   *G01R 31/08*   (2006.01)

(52) U.S. Cl.
   CPC ............ *G01R 31/11* (2013.01); *G01R 31/088* (2013.01)

(58) Field of Classification Search
   CPC ............................. G01R 31/088; G01R 31/11
   See application file for complete search history.

(56) References Cited

U.S. PATENT DOCUMENTS

2004/0039976 A1\*   2/2004   Gunther ............... G01R 31/088
                                                   714/742
2004/0073395 A1\*   4/2004   Furse ..................... G01R 27/04
                                                   702/108

FOREIGN PATENT DOCUMENTS

KR          101403346 B1       6/2014

\* cited by examiner

*Primary Examiner* — Patrick Assouad
*Assistant Examiner* — Haidong Zhang
(74) *Attorney, Agent, or Firm* — Kaplan Breyer Schwarz & Ottesen, LLP

(57) ABSTRACT

An apparatus and method for detecting a cable fault which simultaneously apply a plurality of measurement frequencies mutually orthogonal to a cable and estimate reflection coefficients at the measurement frequencies using filters for filtering only the respective measurement frequencies to reduce a time taken to detect a cable fault.

5 Claims, 4 Drawing Sheets

APPARATUS AND METHOD FOR DETECTING CABLE FAULT

CROSS-REFERENCE TO RELATED APPLICATION

This application claims priority to and the benefit of Korean Patent Application No. 10-2015-0004432, filed on Jan. 12, 2015, the disclosure of which is incorporated herein by reference in its entirety.

FIELD OF THE INVENTION

The present invention relates to an apparatus and method for detecting a cable fault, and more particularly, to an apparatus and method for detecting a cable fault which simultaneously apply a plurality of measurement frequencies mutually orthogonal to a cable and estimate reflection coefficients at the measurement frequencies using filters for filtering only the respective measurement frequencies to remarkably reduce a time taken to detect a cable fault.

BACKGROUND OF THE INVENTION

As is well known, methods of determining whether or not there is a fault in a conducting wire and detecting a distance to fault (DTF) using a reflected wave generally include time domain reflectometry (TDR), frequency domain reflectometry (FDR), and so on.

In TDR, a pulse signal or a step signal is applied to one end of a target conducting wire as a reference signal, and whether or not there is a fault is determined according to the phases of a reflected signal and the reference signal at a DTF in the conducting wire, that is, at a position at which the characteristic impedance of the conducting wire is discontinuous. Also, a delay between the reference signal and a reflected signal is measured to calculate the DTF. This method has a drawback in that a measurement error increases when the rising time of the reference signal is increased to improve resolution.

FDR has two methods. According to a first method, whether or not there is a fault in a conducting wire and a DTF are determined from a peak and a null of a standing wave generated when a sine wave applied as a reference signal and having a fixed frequency band is combined with a signal reflected by a faulty portion of the conducting wire. The resolution and the maximum measurement distance of this method are limited according to frequency sweeping and a frequency bandwidth. Also, this method is sensitive to noise and thus has low accuracy and reliability in detecting a fault in a conducting wire.

According to a second method of FDR, a mismatch point is detected by estimating a channel characteristic and an impulse response of a cable, so that a DTF in the cable is estimated. According to this method, it is possible to maintain a high signal-to-noise ratio (SNR) while using a relatively low power amplifier. Also, a measurement time can lengthen, and thus it is possible to maintain a measurement error and the resolution at desired levels.

FIG. 1 is a block diagram of a general apparatus for measuring a reflected wave which can be applied to FDR. As shown in FIG. 1, an apparatus for measuring a reflected wave which can be applied to FDR mixes an oscillation signal having a center frequency of 1.8 GHz, for example, a carrier frequency of a long term evolution (LTE) system generated by a local oscillator (LO), with a baseband sine signal having been subjected to up-conversion, for example, a measurement frequency signal (RF source) belonging to 20 MHz which is the band of use in the case of the LTE system, using a mixer to output only a baseband sine signal, performs analog-to-digital (A/D) conversion on the baseband sine signal at a predetermined sampling rate, and then estimates a reflection coefficient.

The estimated frequency-domain reflection coefficient is subsequently converted into time-domain information, and it is possible to detect a DFT by finding a time point at which a mismatch has occurred in the time-domain information. Existing measurement of a reflected wave can be generally performed using Equation 1 below.

$$y(n)=\Gamma_M x(n)+w(n), n=1 \ldots N \quad \text{[Equation 1]}$$

In Equation 1 above, x(n) denotes a forward coupling signal, y(n) denotes a reverse coupling signal, and w(n) denotes noise inevitably generated by a coupler and so on. An optimal solution for estimating $\Gamma_A$ can be calculated by the least square method as Equation 2 below.

$$Y = X\Gamma + W \quad \text{[Equation 2]}$$
$$YX^H = XX^H \Gamma + WX^H$$
$$\Gamma_M = YX^H / XX^H = \frac{\Sigma y(n)x(n)^*}{\Sigma x(n)x(n)^*}$$
$$X = [x(1)\ldots x(n)]^T, \text{; forward signal vector}$$
$$Y = [y(1)\ldots y(n)]^T, \text{; reverse signal vector}$$
$$W = [w(1)\ldots w(n)]^T; \text{noise vector}$$

In Equation 2 above, $X^H$ denotes a conjugate transpose, that is, a Hermitian operator. Meanwhile, to improve the accuracy of measuring $\Gamma_A$, it is very important to make the term "$WX^H$" close to zero in Equation 2 by reducing as much influence of noise as possible using an average obtained from a large enough number of measurement values.

A cable fault may be remarkably shown at a specific frequency. Therefore, to accurately find the fault, it is necessary to use up to 1000 or more measurement frequencies over the whole area of a frequency band to be actually used.

In other words, according to an existing apparatus for detecting a cable fault, a process of collecting a reflection coefficient using one measurement frequency at a time is repeated up to 1000 or more times. Also, due to a process of changing and stabilizing a measurement frequency and a need for a sufficient measurement time to ensure the reliability of measurement, it takes a very long time to detect a cable fault.

This work was supported by the ICT R&D program of MSIP/IITP, Republic of Korea. [14-911-01-003, Development of software-based measuring equipment for enhancing inspection of radio station]

Related Documents

1. Korean Patent No. 10-1403346 (Method and System for diagnosing fault of conducting wire)

SUMMARY OF THE INVENTION

The present invention is directed to an apparatus and method for detecting a cable fault which simultaneously apply a plurality of measurement frequencies mutually orthogonal to a cable and estimate reflection coefficients at the measurement frequencies using filters for filtering only the respective measurement frequencies to remarkably reduce a time taken to detect a cable fault.

According to an aspect of the present invention, there is provided an apparatus for detecting a cable fault, the apparatus including: an input unit configured to receive settings of an overall bandwidth of measurement frequencies and a number of measurement frequencies from a user; a measurement frequency generation unit configured to perform up-conversion of as many measurement frequencies included in the set measurement bandwidth as the set number into center frequencies and then generate measurement signals by combining the center frequencies; a forward coupler and a reverse coupler configured to separate the measurement signals and reflected signals of the measurement signal from each other; a matched filter (M/F) generation unit configured to generate a plurality of M/Fs matched with the respective measurement frequencies; a mixer for forwarding and a mixer for reversing configured to mix center frequencies of the signals separated by the respective couplers and output baseband forward measurement frequency signals and baseband reverse measurement frequency signals; an analog-to-digital (A/D) converter for forwarding and an A/D converter for reversing configured to perform A/D conversion on the respective baseband measurement frequency signals at a determined sampling rate; the plurality of M/Fs generated by the M/F generation unit and configured to filter the respective measurement frequency signals converted by the respective A/D converters; and a control unit configured to control the respective units according to the settings, and calculate optimal solutions for estimating actual reflection coefficients based on the forward measurement frequency signals and the reverse measurement frequency signals filtered by the respective M/Fs.

In the above-described constitution, the input unit may receive settings of the center frequencies from the user.

All measurement frequencies generated by the measurement frequency generation unit may be orthogonal to each other.

According to another aspect of the present invention, there is provided a method of detecting a cable fault, the method including: receiving settings of a measurement frequency band and a number of measurement frequencies; generating a plurality of measurement frequencies belonging to the set measurement frequency band, having the number of the measurement frequencies, and orthogonal to each other; performing up-conversion of the respective measurement frequencies into center frequencies, combining the center frequencies, and then applying the combined up-conversion frequencies to a cable as radio frequency (RF) sources; and performing A/D conversion on the respective measurement frequencies mixed with the center frequencies and subjected to down-conversion, and filtering the A/D-converted measurement frequencies using respective M/Fs to calculate optimal solutions to the respective measurement frequencies.

In the above-described constitution, the center frequencies may be set by a user.

This work was supported by the ICT R&D program of MSIP/IITP, Republic of Korea. [14-911-01-003, Development of software-based measuring equipment for enhancing inspection of radio station]

Related Documents

1. Korean Patent No. 10-1403346 (METHOD AND SYSTEM FOR DIAGNOSING FAULT OF CONDUCTING WIRE)

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION

An apparatus and method for detecting a cable fault according to exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

Figure 1:
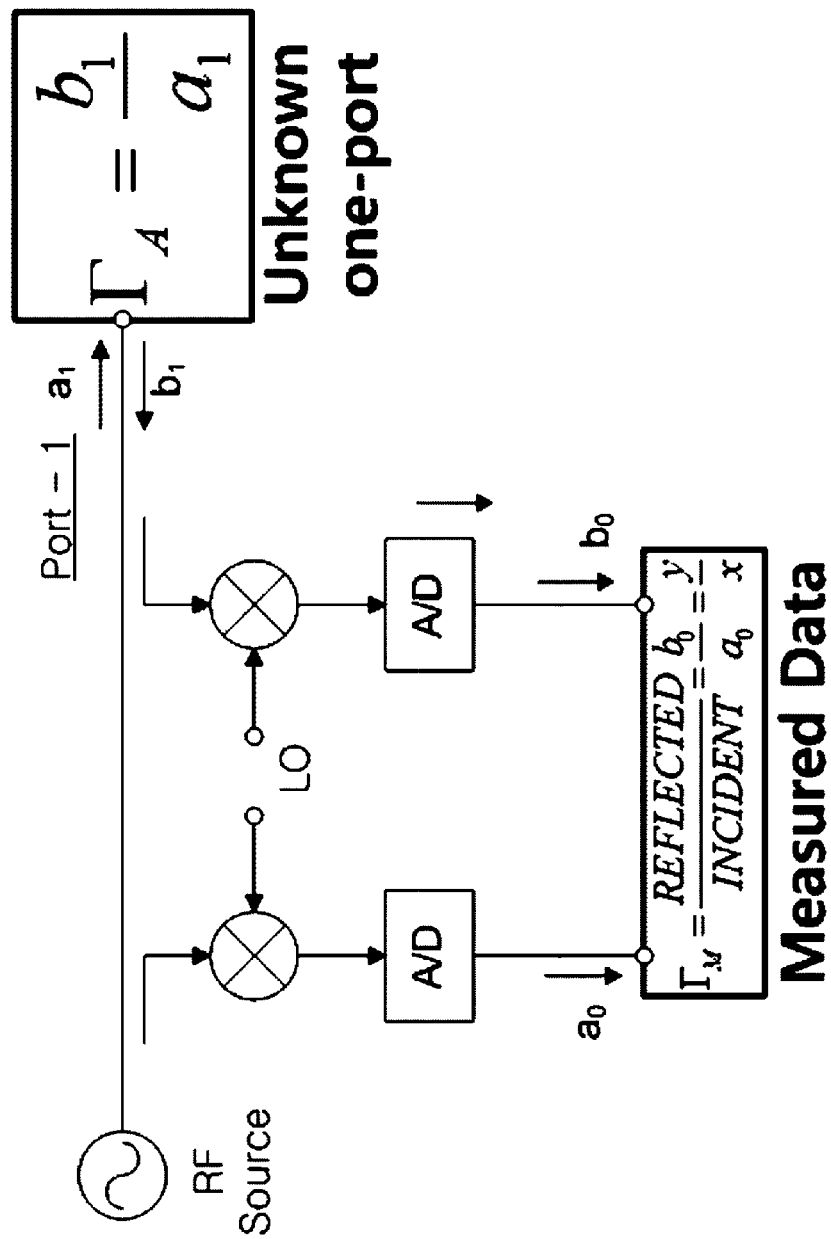
FIG. 1 is a block diagram of a general apparatus for measuring a reflected wave.
Figure 2:
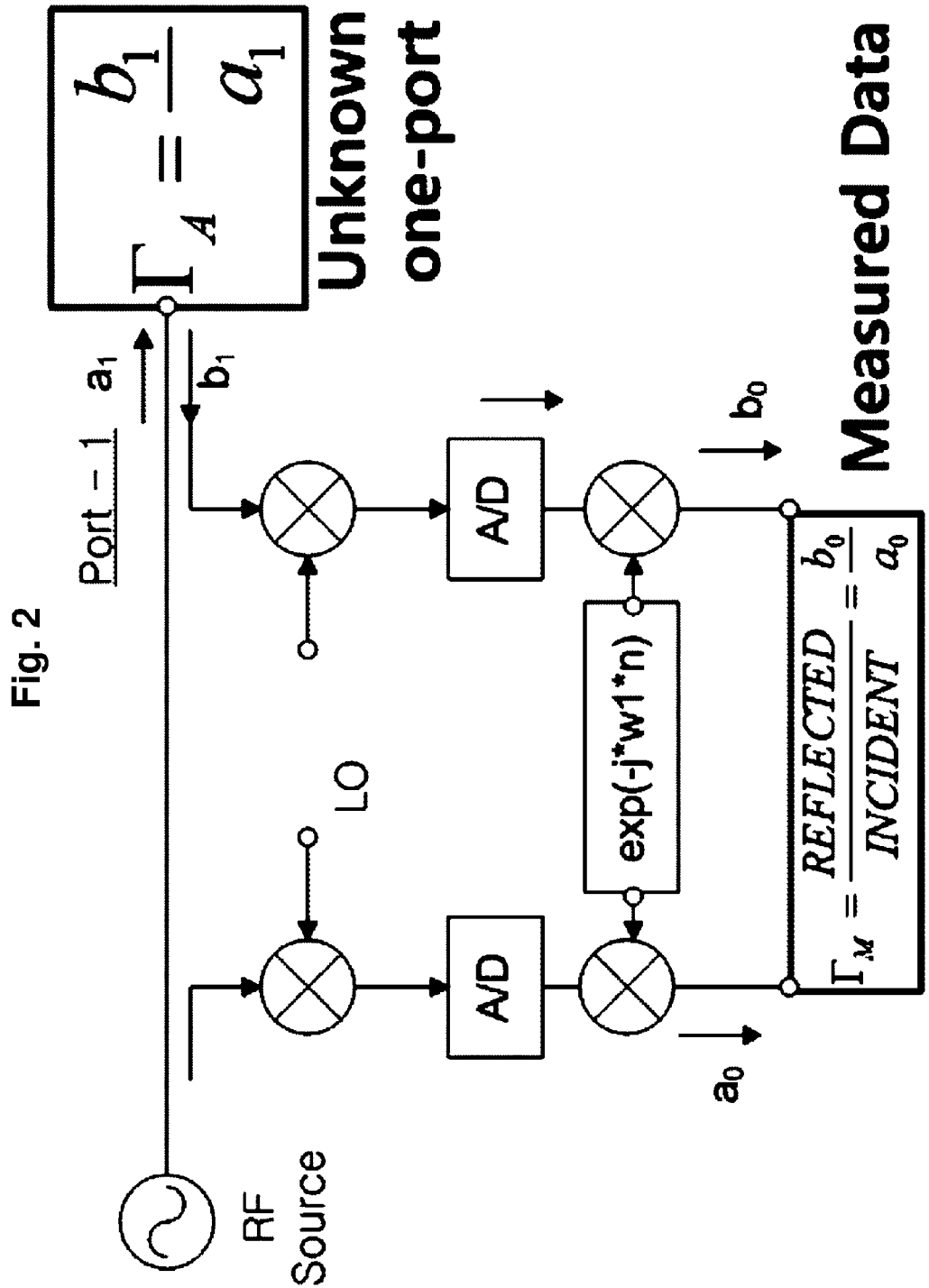
FIG. 2 is a block diagram illustrating a reflected wave measuring principle of an apparatus for detecting a cable fault according to an exemplary embodiment of the present invention.

FIG. 2 is a block diagram illustrating a reflected wave measuring principle of an apparatus for detecting a cable fault according to an exemplary embodiment of the present invention. As shown in FIG. 2, measurement frequency signals x and y are set by a user, and thus their frequency information is known. Also, information to be obtained using the measurement frequency signals x and y is the magnitudes and the phases of reflected waves, which can be measured more accurately using a matched filter (M/F).

As is well known, an M/F minimizes the influence of additive noise, and is a linear time-invariant filter that is matched to an input signal and maximizes the signal-to-noise ratio (SNR) of a received signal at a sampling instant. An M/F in the time domain can be expressed as an impulse response obtained by reversing an input signal on the time axis and then delaying the reversed input signal, and an M/F in the frequency domain can be expressed by a complex conjugate number obtained by performing a Fourier transform on an input signal.

Equation 3 below describes a process of calculating an optimal solution $\Gamma_M$ for estimating $\Gamma_A$ using an M/F.

$$x' = XE^H + W_x E^H; \qquad [\text{Equation 3}]$$

filtered forward signal at matched point $$y' = YE^H + W_y E^H;$$

filtered reverse signal at matched point

-continued $$y' = x'\Gamma_M + w'$$

$$\Gamma_M = \frac{x'}{y'}$$

$$E = [e(1)...e(n)]^T,$$

$$e(n) = \exp(j*2*pi*f1/fs*n)$$

$$X = [x(1)...x(n)]^T, ; \text{forward signal vector}$$

$$Y = [y(1)...y(n)]^T, ; \text{reverse signal vector}$$

$$W_x = [w_x(1)...w_x(n)]^T; \text{noise vector}$$

$$W_y = [w_y(1)...w_y(n)]^T; \text{noise vector}$$

In Equation 3, x' and y' denote a forward coupling signal and a reverse coupling signal filtered at a matched point, respectively, and may be expressed by one value as the inner product (correlation) of X and E. $f_1$ denotes a measurement frequency, and $f_s$ denotes a sampling rate.

Figure 3:
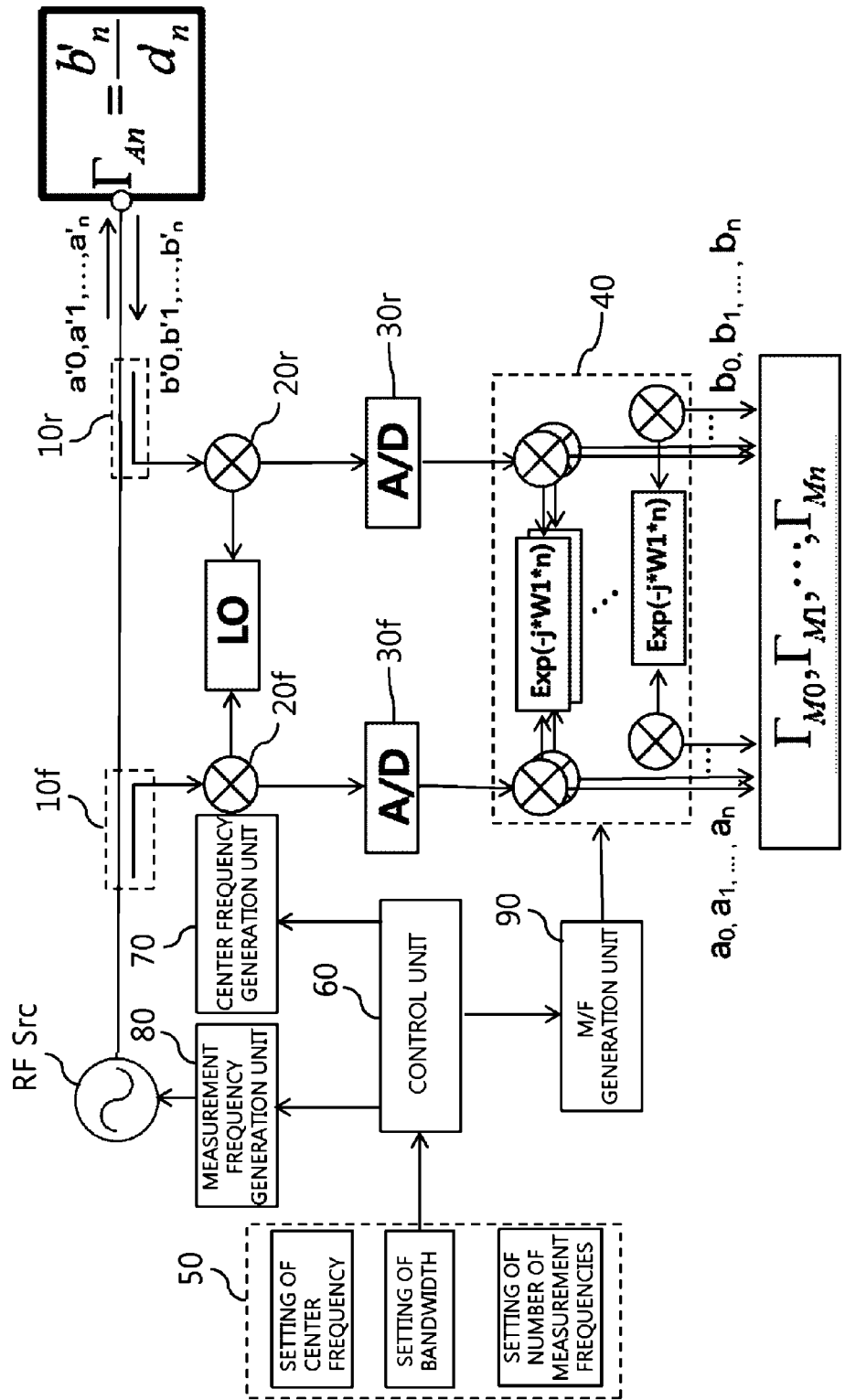
FIG. 3 is an overall block diagram of an apparatus for detecting a cable fault according to an exemplary embodiment of the present invention.

FIG. 3 is an overall block diagram of an apparatus for detecting a cable fault according to an exemplary embodiment of the present invention. As shown in FIG. 3, an apparatus for detecting a cable fault according to an exemplary embodiment of the present invention generally includes an input unit 50 that receives settings of a center frequency wanted to be measured, an overall bandwidth of measurement frequencies to be measured, and a number of measurement frequencies from a user, a measurement frequency generation unit 80 that performs up-conversion of as many measurement frequencies included in the measurement bandwidth set by the user as the number set by the user into center frequencies and then generates measurement signals (radio frequency (RF) source) by combining the center frequencies, a forward coupler 10f and a reverse coupler 10r that separate the measurement signals and reflected signals of the measurement signals from each other, a center frequency generation unit 70 that generates the center frequency set by the user and outputs the center frequency as a local oscillation signal, an M/F generation unit 90 that generates a plurality of M/Fs matched with the respective measurement frequencies, a mixer for forwarding 20f and a mixer for reversing 20r that mix center frequencies of the signals separated by the forward coupler 10f and the reverse coupler 10r respectively and output baseband forward measurement frequency signals and baseband reverse measurement frequency signals, an analog-to-digital (A/D) converter for forwarding 30f and an A/D converter for reversing 30r that perform A/D conversion on the baseband forward measurement frequency signals and the baseband reverse measurement frequency signals respectively at a determined sampling rate, the plurality of M/Fs 40 that perform matched filtering of the respective measurement frequency signals converted by the respective A/D converters 30f and 30r and output filtered signals whose noise has been minimized, that is, whose SNR has been maximized, and a control unit 60 that controls the measurement frequency generation unit 80, the center frequency generation unit 70, and the M/F generation unit 90 according to the settings received by the input unit 50, and calculates optimal solutions $\Gamma_M$ for estimating actual reflection coefficients $\Gamma_A$ based on forward coupling signals and reverse coupling signals of the respective measurement frequency signals filtered by the respective M/Fs 40.

In the above-described constitution, when the center frequency, the overall bandwidth of measurement frequencies to be measured, and the number of measurement frequencies are set by the user, the control unit 60 automatically generates a baseband measurement frequency corresponding to the set values, and all the generated measurement frequencies are required to be orthogonal to each other.

When the number of samples used to measure a signal is T, the measurement frequency signals are $f_N$, and the sampling rate is $f_s$, each of the measurement frequency signals $f_N$ can be given as shown in Equation 4 below, and likewise a matched filter for each measurement frequency can be generated by Equation 5 below.

$$f_N = \frac{f_s}{T} * N (N = 1, 2, 3, ..., T) \quad \text{[Equation 4]}$$

$$e(n) = \exp(j*2*pi*f_N/fs*n) \quad \text{[Equation 5]}$$

The optimal solution $\Gamma_M$ for estimating the actual reflection coefficient $\Gamma_A$ at the respective measurement frequencies can be calculated by Equation 6 below, but only an optimal solution $\Gamma_{M1}$ at a measurement frequency x(1) is shown for convenience.

$$Y_1 + Y_2 + ... + Y_n = X_1\Gamma_1 + X_2\Gamma_2 + ... + X_n\Gamma_n + W \quad \text{[Equation 6]}$$

$$Y_1E_1^H + Y_2E_1^H + ... + Y_nE_1^H =$$

$$X_1E_1^H\Gamma_1 + X_2E_1^H\Gamma_2 + ... + X_nE_1^H\Gamma_n + WE_1^H$$

$$Y_1E_1^H + 0 + ... + 0 = X_1E_1^H\Gamma_1 + 0 + ... + 0 + 0$$

$$\Gamma_{M1} = Y_1E_1^H/X_1E_1^H = \frac{\Sigma y_1(n)e_1(n)^*}{\Sigma x_1(n)e_1(n)^*}$$

$$X = [x(1)...x(n)]^T, ;$$

forward coupling signal vector $$Y = [y(1)...y(n)]^T, ; \text{reverse coupling signal vector}$$

$$W = [w(1)...w(n)]^T; \text{noise vector}$$

$$E = [e(1)...e(n)]^T,$$

$$e(n) = \exp(j*2*pi*f1/fs*n);$$

Matched Filter Vector

The control unit 60 determines whether or not there is a cable fault and a distance to fault (DTF) in the cable according to results of converting respective optimal solutions $\Gamma_M$ at respective measurement frequencies to the time domain. This is well-known art, and a description thereof will be omitted.

Figure 4:
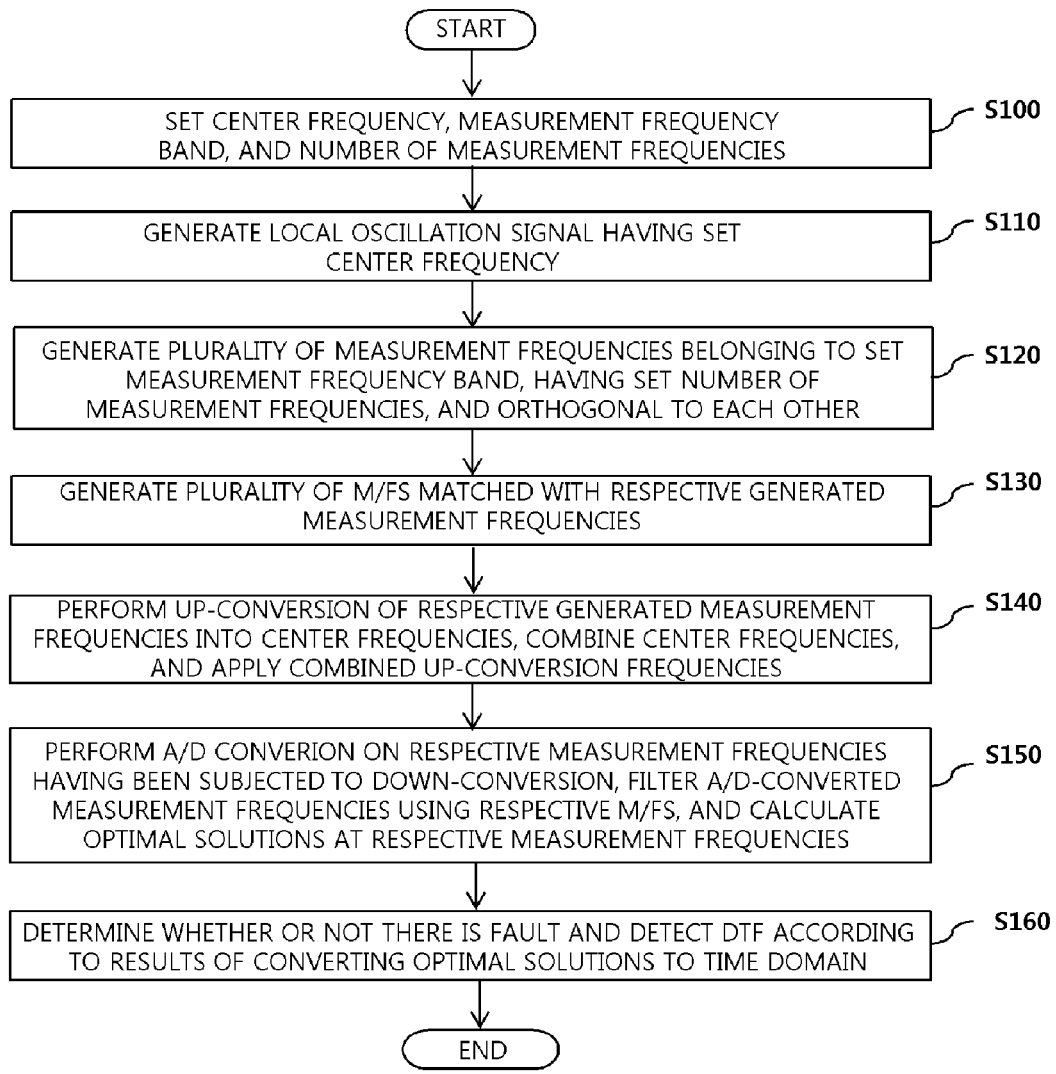
FIG. 4 is a flowchart illustrating a method of detecting a cable fault according to an exemplary embodiment of the present invention.

FIG. 4 is a flowchart illustrating a method of detecting a cable fault according to an exemplary embodiment of the present invention. Unless specified otherwise, a control unit performs the method. First, in operation S100, settings of a center frequency, a measurement frequency band, and the number of measurement frequencies are received from a user.

Next, in operation S110, a local oscillation signal having the center frequency set by the user is generated. Subsequently, in operation S120, a plurality of measurement frequencies which belong to the set measurement frequency band, have the set number of measurement frequencies, and are orthogonal to each other are generated.

Next, in operation S130, a plurality of M/Fs matched with the respective measurement frequencies generated in operation S120 are generated. Apart from operation S130, in operation S140, up-conversion of the respective generated measurement frequencies into center frequencies is performed, and the center frequencies are combined and applied to a cable as RF sources. Subsequently, in operation S150, the respective measurement frequencies which have been mixed with the center frequencies and thus subjected to down-conversion are subjected to A/D conversion, and filtered through respective M/Fs, so that optimal solutions at the respective measurement frequencies are calculated.

Finally, in operation S160, whether or not there is a cable fault and a DTF are determined according to results of converting the optimal solutions calculated in operation S150 to the time domain.

An apparatus and method for detecting a cable fault according to exemplary embodiments of the present invention simultaneously apply a plurality of measurement frequencies mutually orthogonal to a cable and simultaneously estimate reflection coefficients at the measurement frequencies using M/Fs for filtering only the respective measurement frequencies. Therefore, it is possible to remarkably reduce a time taken to detect a cable fault, and improve the reliability of measurement using the M/Fs.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. An apparatus for detecting a cable fault, the apparatus comprising:
    an input unit configured to receive settings of an overall bandwidth of measurement frequencies and a number of measurement frequencies from a user;
    a measurement frequency generation unit configured to perform up-conversion of as many measurement frequencies included in the set measurement bandwidth as the set number into center frequencies and then generate measurement signals by combining the center frequencies;
    a forward coupler and a reverse coupler configured to separate the measurement signals and reflected signals of the measurement signals from each other;
    a matched filter (M/F) generation unit configured to generate a plurality of M/Fs matched with the respective measurement frequencies;
    a mixer for forwarding and a mixer for reversing configured to mix center frequencies of the signals separated by the respective couplers, and output baseband forward measurement frequency signals and baseband reverse measurement frequency signals;
    an analog-to-digital (A/D) converter for forwarding and an A/D converter for reversing configured to perform A/D conversion on the respective baseband measurement frequency signals at a determined sampling rate;
    the plurality of M/Fs generated by the M/F generation unit and configured to filter the respective measurement frequency signals converted by the respective A/D converters; and
    a control unit configured to control the respective units according to the settings, and calculate optimal solutions for estimating actual reflection coefficients based on the forward measurement frequency signals and the reverse measurement frequency signals filtered by the respective M/Fs.

2. The apparatus of claim 1, wherein the input unit receives settings of the center frequencies from the user.

3. The apparatus of claim 1, wherein all measurement frequencies generated by the measurement frequency generation unit are orthogonal to each other.

4. A method of detecting a cable fault, the method comprising:
    receiving settings of a measurement frequency band and a number of measurement frequencies;
    generating a plurality of measurement frequencies belonging to the set measurement frequency band, having the number of the measurement frequencies, and orthogonal to each other;
    performing up-conversion of the respective measurement frequencies into center frequencies, combining the center frequencies, and then applying the combined up-conversion frequencies to a cable as radio frequency (RF) sources; and
    performing analog-to-digital (A/D) conversion on the respective measurement frequencies mixed with the center frequencies and subjected to down-conversion, and filtering the A/D-converted measurement frequencies using respective matched filters (M/Fs) to calculate optimal solutions to the respective measurement frequencies.

5. The method of claim 4, wherein the center frequencies are set by a user.

* * * * *